United States Patent [19]

Van Gorkom et al.

[11] Patent Number: 4,801,994

[45] Date of Patent: Jan. 31, 1989

[54] SEMICONDUCTOR ELECTRON-CURRENT GENERATING DEVICE HAVING IMPROVED CATHODE EFFICIENCY

[75] Inventors: Gerardus G. P. Van Gorkom; Arthur M. E. Hoeberechts, both of Eindhoven, Netherlands

[73] Assignee: U.S. Philips Corporation, New York, N.Y.

[21] Appl. No.: 21,937

[22] Filed: Mar. 5, 1987

[30] Foreign Application Priority Data

Mar. 17, 1986 [NL] Netherlands ........................ 8600675

[51] Int. Cl.[4] ..................... H01L 33/00; H01L 29/34; H01L 29/12

[52] U.S. Cl. ........................................ 357/52; 357/13; 357/16; 357/17; 357/58; 313/346 R; 313/499; 313/366

[58] Field of Search ....................... 357/13, 16, 52, 17, 357/58; 313/499, 366, 346 R

[56] References Cited

U.S. PATENT DOCUMENTS

| | | | |
|---|---|---|---|
| 4,000,503 | 12/1976 | Matare | 357/52 |
| 4,259,678 | 3/1981 | Van Gorkom et al. | 357/13 |
| 4,303,930 | 12/1981 | Van Gorkom et al. | 357/13 |
| 4,325,084 | 4/1982 | Van Gorkom et al. | 357/13 |
| 4,352,117 | 9/1982 | Cuomo et al. | 357/52 |
| 4,506,284 | 3/1985 | Shannon | 357/13 |
| 4,516,146 | 5/1985 | Shannon et al. | 357/13 |

*Primary Examiner*—Martin H. Edlow
*Assistant Examiner*—Donald J. Featherstone
*Attorney, Agent, or Firm*—Steven R. Biren

[57] ABSTRACT

By providing an intrinsic semiconductor region in a reverse biased junction cathode between an n-type surface region and a p-type zone, a maximum field is present over the intrinsic region in the operating condition. The efficiency of the cathode is increased because avalanche multiplication can now occur over a greater distance, while in addition electrons to be emitted at a sufficient energy are generated by means of tunneling.

19 Claims, 5 Drawing Sheets

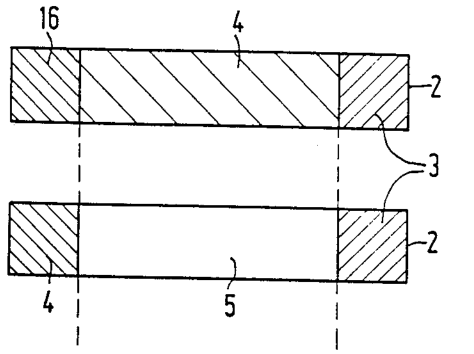
FIG. 1a
FIG. 1b
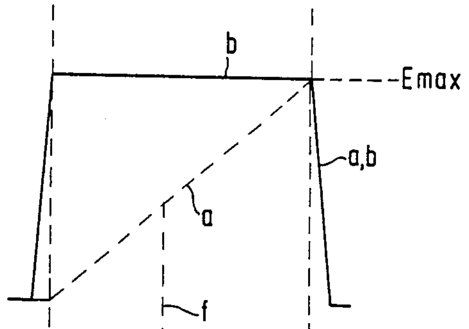
FIG. 2
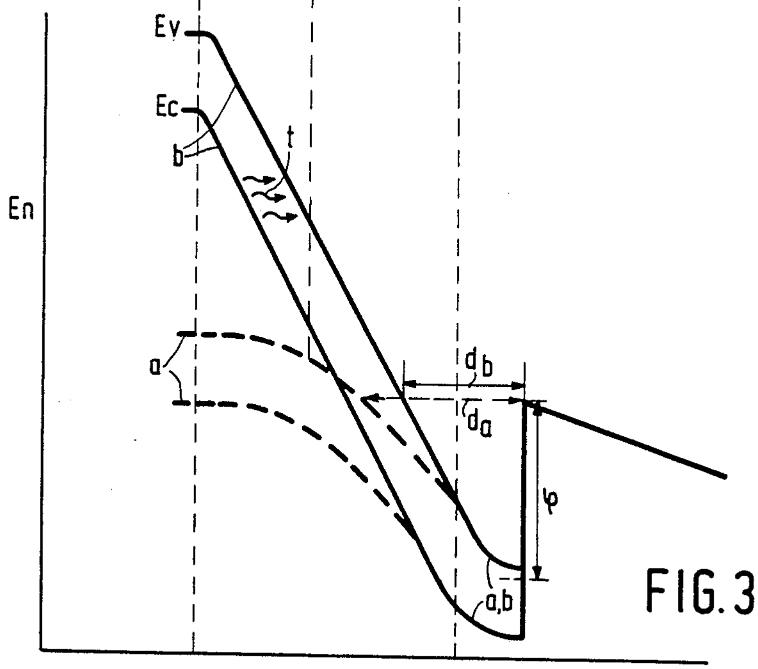
FIG. 3

SEMICONDUCTOR ELECTRON-CURRENT GENERATING DEVICE HAVING IMPROVED CATHODE EFFICIENCY

BACKGROUND OF THE INVENTION

The invention relates to a semiconductor device for generating an electron beam, comprising a cathode having a semiconductor body with an n-type surface region and a p-type region, in which electrons leaving the semiconductor body can be generated in said body by giving the n-type surface region a positive bias with respect to the p-type region.

The invention also relates to a pick-up tube and a display device provided with such a semiconductor device.

Semiconductor devices of the type described above are known from Netherlands Patent Application No. 7905470 (corresponding to U.S. Pat. No. 4,303,930).

They are used, inter alia, in cathode ray tubes in which they replace the conventional thermionic cathode in which electron emission is generated by heating. In addition they are used in, for example, apparatus for electron microscopy. In addition to the high energy consumption for the purpose of heating, thermionic cathodes have the drawback that they are not immediately ready for operation because they have to be heated sufficiently before emission occurs. Moreover, the cathode material is lost over time due to evaporation, so that these cathodes have a limited lifetime.

In order to avoid the heating source which is troublesome in practice and also to mitigate the other drawbacks, research has been done in the field of cold cathodes.

The cold cathodes known from the patent application are based on the emission of electrons from the semiconductor body when a pn-junction is operated in the reverse direction in such a manner that avalanche multiplication occurs. Some electrons may then obtain as much kinetic energy as is required to exceed the electron work function; these electrons are then liberated on the surface and thus supply an electron current.

In this type of cathode the aim is to have maximum possible efficiency, which can be achieved by a minimum possible work function for the electrons. The latter is realized, for example, by providing a layer of material on the surface of the cathode, which decreases the work function. Cesium is preferably used for this purpose because it produces a maximum decrease of the electron work function.

However, the use of cesium may have drawbacks. Inter alia, cesium is very sensitive to the presence (in its ambiance) of oxidizing gases (water vapor, oxygen, $CO_2$). Moreover, cesium is fairly volatile, which may be detrimental in those uses in which substrates or compounds are present in the vicinity of the cathode such as may be the case, for example, in electron lithography or electron microscopy. The evaporated cesium may then precipitate on the objects.

SUMMARY OF THE INVENTION

It is an object of the present invention to provide, inter alia, a semiconductor device of the type described above in which a material decreasing the work function need not always be used so that the above-mentioned problems do not occur.

It is another object of the invention to provide cold cathodes of the type described which have a much higher efficiency if the use of cesium or an other material decreasing the work function involves no problems or negligibly few problems.

To this end a semiconductor device according to the invention is characterized in that a substantially intrinsic semiconductor region is present between the n-type surface region and the p-type region.

A substantially intrinsic semiconductor region is herein understood to mean a region having a light p-type or n-type doping with an impurity concentration of not more than $5.10^{16}$ atoms/$cm^3$.

The substantially intrinsic layer introduces in the semiconductor device a region which in the operating condition is completely depleted and in which a maximum field strength prevails substantially throughout this region. As a result the electrons are generated earlier and at a higher potential energy, while the generated electrons in the intrinsic part undergo a slight scattering of ionized dopant atoms so that the effective free path length is increased.

In addition it is found that electron emission is possible because in the intrinsic part electrons in the valence band have a potential which is higher than the work function of the material so that emission by means of the tunnel effect is also possible.

The electrons may alternatively be injected via the p-type zone in the intrinsic part with a similar structure as described in British patent specification No. 2,109,159.

To this end such a device is characterized in that the p-type region is present between the intrinsic semiconductor region and a second n-type region in which only the n-type regions of the npin structure thus formed are provided with contact electrodes and the p-type region constitutes a barrier for electron transport from the second n-type region to the n-type surface region until the n-type surface region is sufficiently positively biased with respect to the second n-type region so as to inject hot electrons in the substantially intrinsic region at a sufficient energy to exceed the work function at the surface, the p-type region having such a thickness and doping that it is substantially completely depleted at the said potential difference.

In a preferred embodiment the p-type region is already completely depleted at a potential difference of 0 volt.

A further preferred embodiment of a semiconductor device according to the invention is characterized in that the surface has an electrically insulating layer in which at least one aperture is provided, in which at least an acceleration electrode is provided on the insulating layer on the edge of the aperture and in which the pin structure at least within the aperture locally has a lower breakdown voltage than the other part of the pin structure, the part having the lower breakdown voltage being separated from the surface by an n-type conducting layer having such a thickness and doping that at the breakdown voltage the depletion zone of the pin-structure does not extend as far as the surface but remains separated therefrom by a surface layer which is sufficiently thin to pass the generated electrons.

By providing the pin structure with such an acceleration electrode, similar advantages can be obtained as described in Netherlands Patent Application No. 7905470.

A cathode according to the invention may be advantageously used in a pick-up tube, while there are also various uses for a display device comprising a semiconductor cathode according to the invention. One use is, for example, a display tube having a fluorescent screen which is activated by the electron current originating from the semiconductor.

BRIEF DESCRIPTION OF THE DRAWING

The invention will now be described in greater detail with reference to several embodiments and the drawing, in which:

FIG. 1*a* and *b* diagrammatically shows a comparison between the structure of a semiconductor device according to the invention and that of the device described in the Netherlands patent application No. 7905470;

FIG. 2 diagrammatically shows a comparison of the associated prevailing field strength in the semiconductor body;

FIG. 3 diagrammatically shows the associated energy diagrams;

Figure 4:
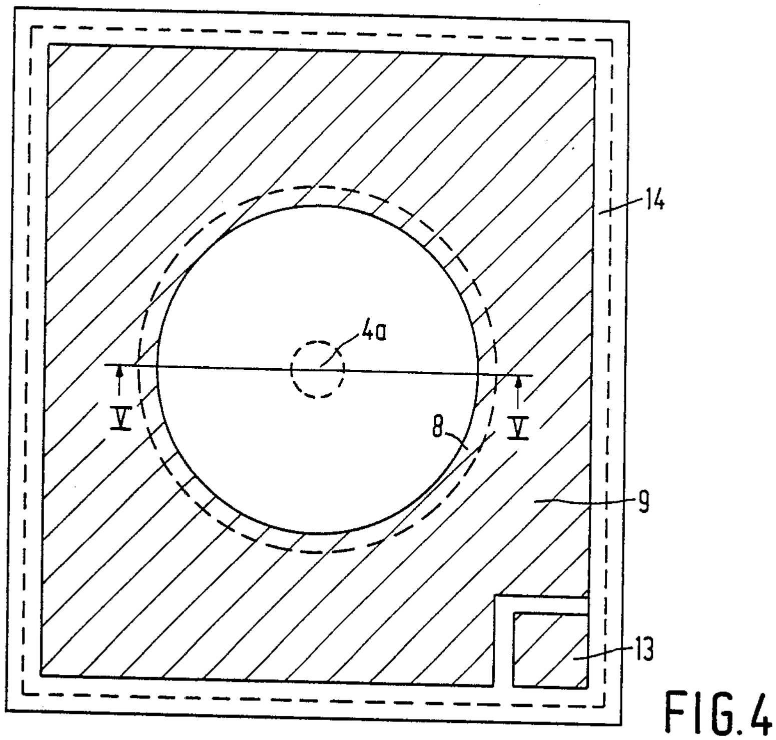
FIG. 4 is a diagrammatical plan view of a semiconductor device according to the invention.

The Figures are shown diagrammatically and are not to scale, and for the sake of clarity the dimensions in the direction of thickness have been greatly exaggerated in the cross-sections. Semiconductor zones of the same conductivity type are generally shaded in the same direction; corresponding parts in the Figures are generally indicated by the same reference numerals.

DESCRIPTION OF THE PREFERRED EMBODIMENTS

The advantages of a semiconductor device according to the invention will now be described with reference to FIGS. 1 to 3 and compared with those as described in Netherlands patent application No. 7905470. The device described in the Application (FIG. 1*a*) comprises at a main surface 2 of a semiconductor body 1 an n-type surface region 3 constituting a pn-junction with a p-type region 4. The regions 4 and 5 may be biased in the reverse direction with respect to each other so that avalanche multiplication occurs. The electrons which are then liberated may then obtain as much energy as is required to be emitted from the semiconductor body.

In a device according to the present invention an intrinsic semiconductor region 5 (FIG. 1b) is present between the n-type surface region 3 and the p-type region 4. For sake of the example it has been assumed for the device of FIG. 1*a* that the p-type region 5 is completely depleted during use. The boundaries of the depletion zones are substantially at the same distance from the surface 2 in both devices; the p-type region may be contacted via a $p^+$-region 16.

FIG. 2 diagrammatically shows the variation of the field strength for the two devices. For the device of FIG. 1*a* a maximum field occurs at the area of the pn-junction, which field decreases to the value of zero on both sides of the junction on the edges of the depletion zone (line a). Such a field variation leads to an electron energy diagram as is shown by means of broken lines (a) in FIG. 3. Viewed from the surface 2 the work function is initially zero until it increases in the depletion zone to a value of approximately 0.8 volt (in silicon) at the area of the pn junction. Since it applies that $$E = -(dV)/(dx)$$

and the field E decreases from this point (see FIG. 2, line a), the curve a in FIG. 3 increases less and less steeply from this point until the electron energy remains constant from the edge of the depletion zone.

In the device of FIG. 1*b* the entire intrinsic region 5 is depleted due to the low concentration of impurities and the field strength is also substantially constant due to the lack of space charge in this region 5. As a result the maximum field is maintained over the entire region 5 (line b). In the electron energy diagram this implies a linear increase of the electron energy (potential) as far as the junction of the intrinsic region 5 and the p-type region 4 where the field decreases rapidly and hence also the increase in electron energy which results in line b for the electron energy diagram in FIG. 3. The electron energy increases to far above the energy which electrons must have to be able to reach the vacuum.

To be able to reach the vacuum the electrons must have an energy which is at least equal to the emission energy $\phi$. For an electron which has an energy which is equal to or higher than this emission energy at a distance x from the surface, the chance of emission is given by $p = Ae^{-x/\lambda}$ where A is a standardizing constant and $\lambda$ is an effective free path length.

For the electrons of the devices described it applies that this chance of electrons just having this potential energy is given by $P_a = Ae^{-da/\lambda a}$ and $P_b = Ae^{db/\lambda b}$, respectively.

As described above, the energy diagram in case b increases more steeply so that $d_b < d_a$ (see also FIG. 3). In addition it applies that $\lambda_b > \lambda_a$ because in the intrinsic semiconductor material there is less interaction between the electrons and the grid. This makes it evident that $P_b > P_a$ and that there is a considerably higher emission chance for the electrons in the structure of FIG. 1*b*.

To determine the efficiency completely, the chance P is to be further multiplied by a factor $\epsilon$ for electrons which are generated at a distance which is larger than $d_a$ and $d_b$, respectively (or electrons with a potential energy which is larger than the emission energy). This factor is very different for the two configurations, notably because generation of electrons by avalanche multiplication substantially does not take place in the case of an electric field which is smaller than approximately $3.10^5$ V/cm. In the configuration of FIG. 1*a* this field is, for example, reached at the point f, whereafter the energy increase in the accelerating field is such that avalanche multiplication remains small. In the configuration of FIG. 1*b* a maximum field of, for example, approximately $10^6$ V/cm prevails in the entire region 5 so that avalanche multiplication is initiated at a much larger scale, which results in a larger value of $\epsilon$ and hence a still higher efficiency.

Finally in the configuration of FIG. 1*a* the thickness and doping of the regions 3, 4 are chosen to be such that there is just no tunnel breakdown because tunnelling electrons have too little energy with respect to the emission energy. In the configuration according to FIG. 1*b* the field may be chosen to be higher because most tunnelling electrons leave the valence band at places with an energy which is larger than this emission energy (indicated by t in FIG. 3). The two latter effects increase the efficiency of the structure according to FIG. 1*b*. When the tunnel effect is used low drive voltages may (sometimes) suffice.

Figure 5:
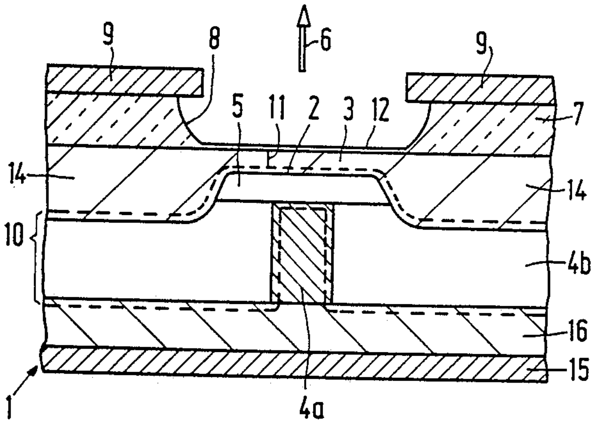
FIG. 5 is a diagrammatical cross-section taken on the line V—V in FIG. 4.

FIG. 4 is a plan view and FIG. 5 is a cross-section taken on the line V—V in FIG. 4 of a semiconductor device adapted to generate an electron beam. To this end this device comprises a cathode having a semiconductor body 1, in this example of silicon. The semiconductor body in this example has an n-type region 3 adjoining the surface 2 of the semiconductor body, which region is separated from a p-type region 4 by an intrinsic semiconductor region 5. The region 4 has a low-ohmic region 4*a* within a high-ohmic or intrinsic zone 4*b*. By applying a positive bias to the region 3 with respect to the region 4 electrons which can be emitted are generated in the semiconductor body. This is shown by means of the arrow 6 in FIG. 5.

In this example the surface 2 has an electrically insulating layer 7 of, for example, silicon oxide in which an aperture 8 is provided at least at the area of the region 4*a*. Furthermore an acceleration electrode 9 which may be of polycrystalline silicon or metal in this example is provided on the insulating layer 7 on the edge of the aperture 8.

The pin-structure formed by the regions 3, 4*a*, 5 locally has a lower breakdown voltage within the aperture 8 than the other part of the structure. In this example the local decrease of the breakdown voltage is obtained because the depletion zone 10 at the breakdown voltage within the aperture 8 is narrower than at other points of the pin structure. The part having the decreased breakdown voltage is separated from the surface 2 by the n-type layer 3. This layer has such a thickness and doping that the depletion zone 10 does not extend as far as the surface 2 in case of the breakdown voltage. Consequently a surface layer 11 remains present which ensures the conduction of the non-emitted part of the avalanche current and tunnel current. The surface layer 11 is sufficiently thin to pass a part of the electrons generated by avalanche multiplication, which electrons are emitted from the semiconductor body 1 and form the beam 6.

The reduction in width of the depletion zone 10 and hence the local decrease of the breakdown voltage of the pin structure is obtained in the present example by providing a thin intrinsic region within the aperture 8, which constitutes a pin structure with the n-type 3 and the p-type 4*a* while the doping of the region 4*b* is such that there is no breakdown voltage at other sites at the operating voltage of the cathode. The semiconductor device is also provided with a connection electrode 13 connected through a contact hole to the n-type contact zone 14 which is connected to the n-type zone 3. In this example the p-type zone is contacted at the lower side by means of the metallization layer 15. This contacting preferably takes place via a highly doped p-type contact zone 16.

In the example of FIGS. 1 and 2 the donor concentration in the n-type region 3 at the surface is, for example, $10^{19}$ atoms/cm$^3$ while the acceptor concentration in the p-type region 4*a* is, for example, $5.10^{18}$ atoms/cm$^3$. As a result, the depletion zone 10 of the pin structure is constricted at the area of this region, which results in a decreased breakdown voltage. Consequently avalanche multiplication will firstly occur at this area.

The thickness of the n-type region 3 is 5 to 30 nanometers in this example. For the donor concentration sufficient donors can be ionized to reach the field strength (approximately $6 \cdot 10^5$ V/cm) at which sufficient avalanche multiplications starts to occur, while yet a surface layer 11 remains present so that on the one hand conduction can take place while on the other hand this layer is thin enough to pass a part of the generated electrons.

The intrinsic semiconductor region has a thickness of between 3 and 30 nanometers in this example. At relatively low voltages at the connections 13 and 15 the entire region 5 can then be depleted while there is such a high field strength ($10^6$ V/cm) that electrons can leave the semiconductor body by tunnelling. The impurity concentration of the n-type region 3 is such that a surface layer 11 where there is no depletion also remains at these field strengths.

In this example electron emission takes place in a substantially circular region. The acceleration electrode 9 may consist of a plurality of parts, if desired. By giving these parts a different potential the emitting beam can be caused to diverge or converge and be displayed, for example, on the sensitive part of a target plate or it may be distorted in such a manner that aberrations of the electron-optical system can be compensated for.

The aperture 8 has the shape of a circle with a diameter of approximately 10 micrometers in this example. The thickness of the oxide layer is 0.5 micrometer. By choosing these dimensions and by providing the acceleration electrode 9 in close proximity to and preferably around this aperture an equipotential plane is created above the aperture which contributes to the acceleration of the electrons. A converging effect can be obtained with the aid of a small negative potential at this electrode.

In this example the electrically insulating layer 7 consists of silicon oxide while the acceleration electrode 9 consists of polycrystalline silicon, as does the electrode 13. However, any other suitable material may be chosen for the insulating layer such as, for example, a silicon nitride-silicon oxide double layer, while for the electrodes any other material which is conventional in semiconductor technology such as, for example, aluminum can be used.

The emission of electrons may be increased by covering the semiconductor surface 2 within the aperture 8 with a work-function decreasing material, for example, with a layer 12 of material comprising barium or cesium.

Further advantages of the structure of FIG. 4, notably with respect to electron optics are described in Netherlands patent application No. 7905470.

Figure 6:
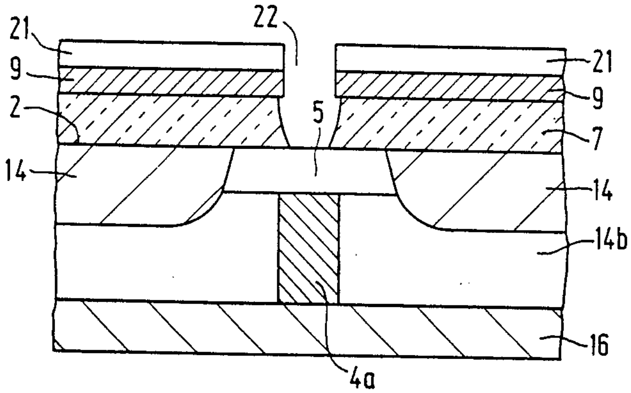
FIGS. 6 to 8 diagrammatically show in a cross-section the device of FIG. 4 during the stages of a manufacturing process.
Figure 7:
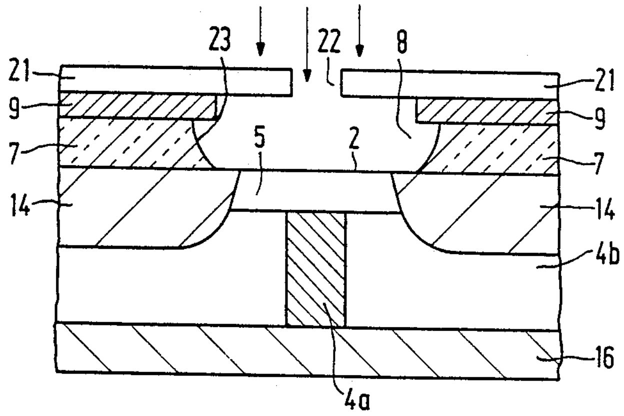

The device according to FIGS. 4 and 5 may be manufactured as follows (see FIGS. 6 and 7).

A semiconductor body 1 is initially made with an n-type region 14 adjoining a surface 2 and an intrinsic semiconductor region 5 adjoining the n-type region, intrinsic being understood to mean that the quantity of p-type or n-type impurities may be not more than $10^{16}$ atoms/cm$^3$ but preferably much less ($10^{14}$–$10^{15}$ atoms/cm$^3$).

This semiconductor body may be obtained, for example, by growing on a p-type silicon substrate 16 having a resistivity of 0.001 ohm.centimeter in this example a substantially intrinsic or, for example, χ-type epitaxial layer having a thickness of approximately 5 micrometers. In this example a second epitaxial layer 5 with a still lighter doping is grown on this layer. The n-type region 14 is provided in the semiconductor body by means of implantation or diffusion of, for example, phosphorus to a depth of approximately 2 micrometers. The doping concentration of the n-type region 14 is, for example, $2.10^{19}$ to $10^{20}$ atoms/cm$^3$ at the surface.

The surface 2 is subsequently coated in known manner with an insulating layer 7 such as silicon oxide, for example, by thermal oxidation. Subsequently an electrically conducting layer 9, for example, a layer of polycrystalline silicon is provided on this layer 7 with a thickness of, for example, 0.5 micrometers. This layer 9 is then coated with a masking layer 21.

In this masking layer 21 a window 22 for the purpose of the next etching step is defined by means of photolithographic etching techniques. The window 22 is dimensioned in such a manner that, viewed in projection, it is located between the parts of the n-type region 14. Subsequently the underlying layer 9 of polycrystalline silicon is etched through the window 22, for example, by means of plasma etching. With the aperture 22 as a mask an aperture is etched in the conventional manner in the oxide layer 7 as far as the surface 2. A combined boron/boron fluoride or boron/gallium implantation is subsequently performed with the layer consisting of oxide 7, polycrystalline silicon 9 and the masking layer 21 as a mask at such an energy and dose that a low ohmic p-type zone 4a is obtained which is contiguous to the substrate 16. This results in the configuration according to FIG. 6.

Etching of the oxide 7 is continued until the aperture is larger than the part of the intrinsic region 5 subjoining the surface 2, which region is bounded by the parts of the n-type region 14,; in other words, etching is continued until, viewed in projection, the edge 23 of the aperture in the polycrystalline silicon lies above the n-type region 14.

The polycrystalline layer 9 is then etched through the window 22, for example, with a solution of hydrofluoric acid and nitric acid in water. During etching the layer 21 functions as a mask so that the configuration according to FIG. 7 is ultimately obtained. When etching the layer 9 the silicon surface is substantially not attacked.

Figure 8:
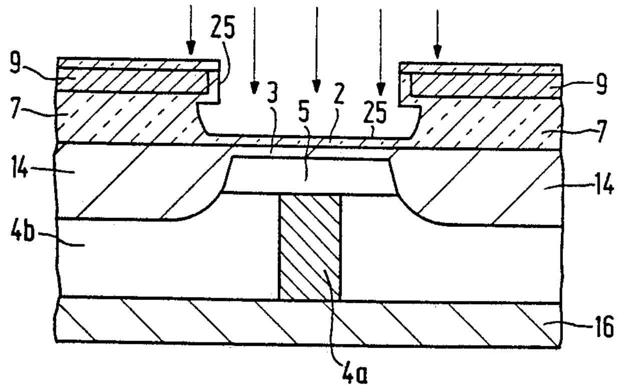

After the masking layer 21 has been removed a light oxidation step is used so that both the semiconductor surface and the edge 23 of the aperture in the polycrystalline silicon layer 9 are coated with an oxide film 25. The oxide film has a thickness of approximately 0.02 micrometer (FIG. 8).

An implantation of donors, for example, a shallow arsenic implantation down to a depth of 0.01micrometer then follows, with the layer 9 and the film 25 functioning as a mask. This implantation is performed, for example, at an energy of 10 kV and a dose of $2.10^{14}$ ions/cm$^2$. After the film 25 has been removed and possibly a layer 12 of work function decreasng material is provided, the semiconductor device of FIG. 4 is obtained.

Epitaxial techniques such as, for example, molecular beam epitaxy (MBE) may of course alternatively be used. For example, a pin structure can be realized by providing on a p-type substrate 16 a thin intrinsic layer 5 (10–100) nanometer at a relatively low temperature by means of MBE and by subsequently providing the n-type surface layer likewise by MBE or by ion implantation.

Figure 9:
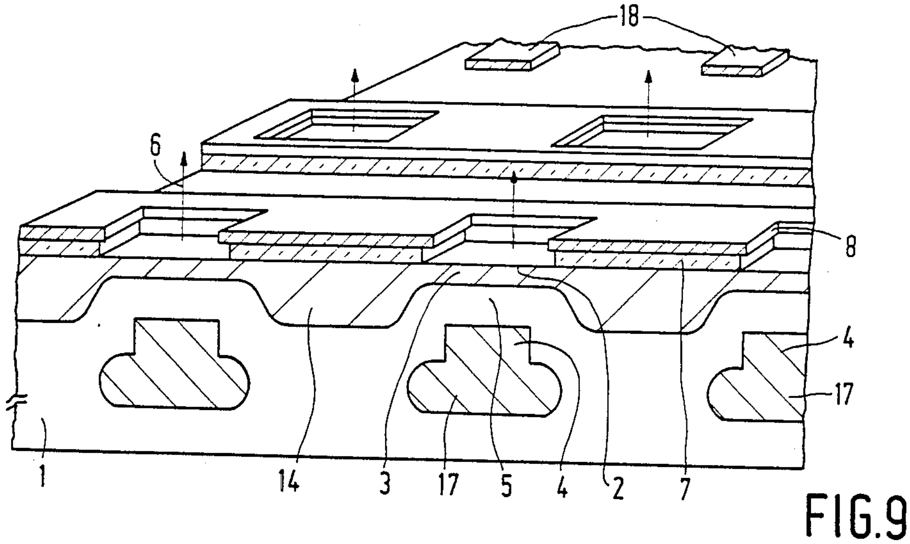
FIG. 9 diagrammatically shows another device according to the invention.

FIG. 9 diagrammatically shows a device according to the invention in which a number of emitting regions are arranged in a matrix structure. The connection zone 16 is replaced by buried p+ type zones 17 which constitute, for example, the row connections, while the mutually separated strip-shaped n+ type zones constitute the column connections and connect the n-type surface regions 3. The zones 17 are contacted on their upper surfaces via contacts 18. Otherwise the reference numerals have the same designations as in the previous Figures.

Figure 10:
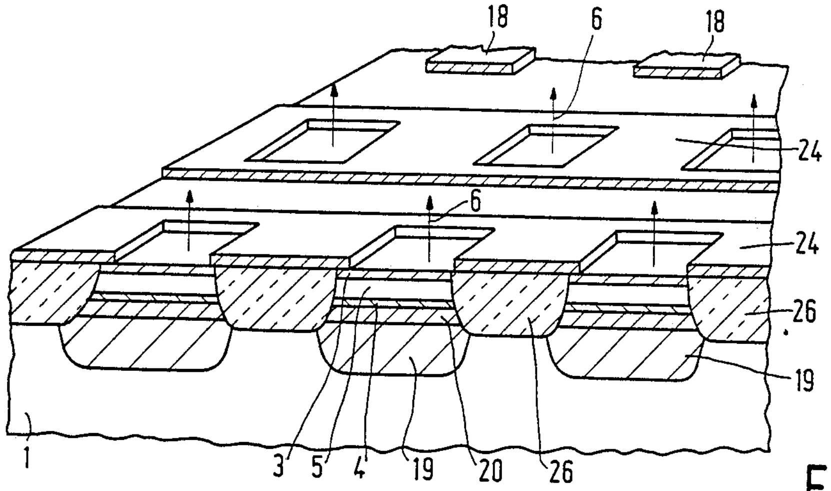
FIG. 10 shows a modification thereof.

FIG. 10 shows a modification in which electron injection takes place in the intrinsic region 5 as described in British patent application No. 2,109,159. The rows are now constituted by buried n+ zones and are contacted on the upper sides via contacts 18. The n-type zones 3 are now contacted via row connections 24, while the n-pin structures are mutually separated by countersunk insulation regions 26. The n+ type buried zones 19 may be separated from the p-type regions 4 via a thin n-type zone 20. For a description of the injection mechanism reference is made to the British patent application.

Figure 11:
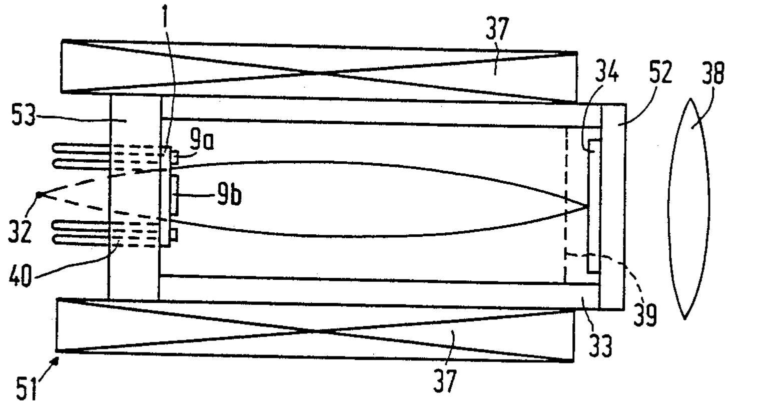
FIG. 11 diagrammatically shows a cathode ray tube in which a semiconductor device according to the invention is used.

FIG. 11 diagrammatically shows a pick-up tube 51 provided with a semiconductor cathode 1 according to the invention. The pick-up tube also comprises a photoconducting target plate 34 in a hermetically closed vacuum tube 33, which plate is scanned by the electron beam 6, while the pick-up tube is also provided with a system of coils 37 for deflecting the beam and with a screen grid 39. A picture to be picked up is projected onto the target plate 34 by means of the lens 38, the end wall 52 being permeable to radiation. For the purpose of electrical connection the end wall 53 has lead-throughs 40. In this example, the semiconductor cathode according to FIGS. 4 and 6 is mounted on the end wall 53 of a pick-up tube 51.

As has been described, a number of cathodes according to the invention with, for example, a round aperture surrounded by an acceleration electrode may be integrated in an XY-matrix in which, for example, the n-type regions are driven by the X-lines and the p-type regions are driven by the Y-lines. With the aid of electronic control equipment, for example, shift registers, whose contents determine which of the X-lines or the Y-lines are driven, a given pattern of cathodes can be emitted while, for example, the potential of the acceleration electrons can be adjusted via other registers in combination with digital-to-analog converters. Flat display devices can be realized therewith in which a fluorescent screen which is activated by the electron current originating from the semiconductor device is present in an evacuated space at a few micrometers from the semiconductor device.

Figure 12:
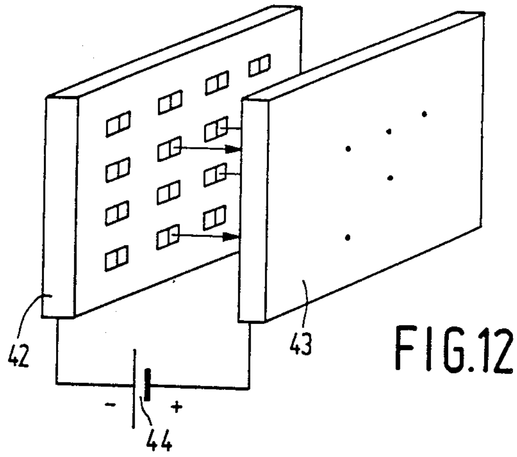
FIG. 12 is a diagrammatic perspective view of a part of a display device in which a semiconductor device according to the invention is used; while FIG. 13 diagrammatically shows such a display device for the purpose of display uses.

FIG. 12 is a diagrammatic perspective elevational view of such a flat display device which in addition to the semiconductor device 42 has a fluorescent screen 43 which is activated by the electron current originating from the semiconductor device. The distance between the semiconductor device and the fluorescent screen is, for example, 5 millimeters while the space in which they are present is evacuated. A voltage of the order of 5 to 10 kV is applied via the voltage source 44 between the semiconductor device 42 and the screen 43, which produces such a high field strength between the screen and the device that the picture of a cathode is of the same order of magnitude as this cathode.

Figure 13:
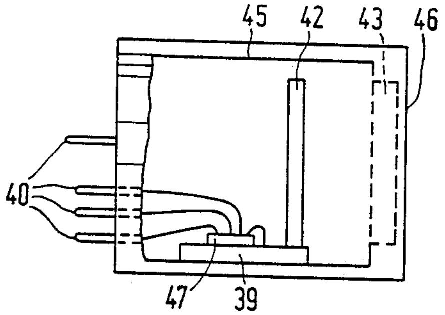

FIG. 13 diagrammatically shows such a display device in which the semiconductor device 42 is provided in an evacuated space 45 at approximately 5 millimeters from the fluorescent screen 43 which forms part of the end wall 46 of this space. The device 42 is mounted on a holder 39 on which, if desired, other integrated circuits 47 for the purpose of the electronic control equipment are provided; the space 45 has lead-throughs 40 for external connections.

Figure 14:
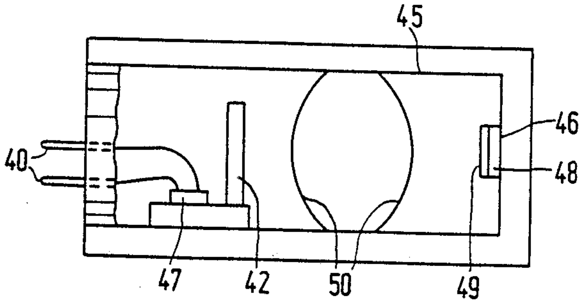
FIG. 14 diagrammatically shows such a display device for use in electron lithography.

FIG. 14 diagrammatically shows a similar vacuum space 45. In this space there is a system 50 of electron lenses shown diagrammatically. For example, a silicon slide 48 coated with a photoresist layer 49 is provided in the end wall 46. The pattern generated in the device 42 is imaged, if necessary in a diminution, on the photoresist layer 49 via the system of lenses 50.

Consequently patterns can be imaged on a photoresist layer with such a device. This provides great advantages because the conventional photo masks can be dispensed with and desired pattern can be generated and, if necessary corrected via the electronic control equipment in a simple manner.

The invention is of course not limited to the examples stated. The substantially intrinsic layer 5 may alternatively be obtained by diffusion from the epitaxial layer **4*b*. The transition between the regions 4*a* and 5 in FIG. 5 is then not abrupt, but gradual. In the embodiment of FIG. 4 the acceleration electrode is not always necessary. If necessary, the n-type layer 4** may be contacted via a metallization pattern. An emitting region may also be divided into a plurality of sub-regions as described in Netherlands patent application No. 8403538. The choice of material also provides a diversity of variations. Instead of silcon other semiconductor materials may be chosen such as those of the $A_3$-$B_5$ type or the $A_2$-$B_6$-type.

A diversity of variations is also possible in the method of manufacture.

What is claimed is:

1. A semiconductor device for generating an electron beam comprising a cathode having a semiconductor body with an n-type surface region and a p-type region, in which electrons leaving the semiconductor body can be generated in said body by giving the n-type surface region a positive bias with respect to the p-type region, characterized in that a substantially intrinsic semiconductor region is present between the n-type surface region and the p-type region.

2. A semiconductor device as claimed in claim 1, characterized in that the substantially intrinsic semiconductor region is of the $\pi$-type or the $\nu$-type with a maximum impurity concentration of $5 \cdot 10^{16}$ atoms/cm$^3$.

3. A semiconductor device as claimed in claim 1, characterized in that the p-type region is present between the intrinsic semiconductor region and a second n-type region in which only the n-type regions of the npin structure thus formed are provided with contact electrodes and the p-type region constitutes a barrier for electron transport from the second n-type region to the n-type surface region until the n-type surface region is sufficiently positively biased with respect to the second n-type region so as to inject electrons in the substantially intrinsic region at a sufficient energy to exceed the work function at the surface, the p-type region having such a thickness and doping that it is substantially completely depleted at the said potential difference.

4. A semiconductor device as claimed in claim 3, characterized in that the p-type region is substantially completely depleted at a bias of 0 volt of the second n-type region with respect to the n-type surface region.

5. A semiconductor device as claimed in claim 1 or 2, characterized in that the surface is an electrically insulating layer in which at least one aperture is provided, in which at least an acceleration electrode is provided on the insulating layer on the edge of the aperture and in which the pin structure, at least within the aperture, locally has a lower breakdown voltage than the other part of the pin structure, the part having the lower breakdown voltage being separated from the surface by an n-type conducting layer having such a thickness and doping that at the breakdown voltage the depletion zone of the pin structure does not extend as far as the surface but remains separated therefrom by a surface layer which is sufficiently thin to pass the generated electrons.

6. A semiconductor device as claimed in claim 5, characterized in that the aperture has the shape of a narrow gap having a width which is of the same order of magnitude as the thickness of the insulating layer.

7. A semiconductor device as claimed in claim 5, characterized in that the acceleration electrode consists of two or more sub-electrodes.

8. A semiconductor device as claimed in claim 7, characterized in that the aperture constitutes a substantially annular gap, one sub-electrode being present within the annular gap and one sub-electrode being present outside the annular gap.

9. A semiconductor device as claimed in claim 8, characterized in that the center line of the annular gap constitutes a circle.

10. A semiconductor device as claimed in claims 1, 2, 3, or 4, characterized in that the surface of the semiconductor body is coated with an electron work function decreasing material at least at the area of the emitting surface.

11. A semiconductor device as claimed in claim 10, characterized in that the electron work function decreasing material selected is a meterial from the group consisting of cesium and barium.

12. A semiconductor device as claimed in claim 1, 2, 3 or 4, characterized in that the semiconductor body comprises silicon.

13. A semiconductor body as claimed in claim 1, 2, 3 or 4, characterized in that the acceleration electrode comprises polycrystalline silicon.

14. A semiconductor device as claimed in claim 1, 2, 3 or 4, characterized in that a countersunk insulating layer provided with at least one aperture surrounding a mesa-shaped part of the semiconductor is present on the surface, at least the intrinsic semiconductor region and the n-type surface region being present within the mesa-shaped part and being bounded by the counter-sunk insulating layer.

15. A semiconductor device as claimed in claim 14, characterized in that the n-type surface regions are contacted on the main surface with the aid of connection electrodes extending across the insulating layer.

16. A semiconductor device as claimed in claim 1, 2, 3 or 4, characterized in that the emitting regions are arranged in a matrix configuration and the n-type surface regions are contacted via connection electrodes or low-ohmic n-type regions constituting column connections, while the row connections are established via low-ohmic buried zones extending in a direction perpendicular to that of the column connections.

17. A pick-up tube provided with means for driving an electron beam, which electron beam scans a charge image, characterized in that the electron beam is generated by means of a semiconductor device as claimed in claim 1, 2, 3 or 4.

18. A display device provided with means for driving an electron beam, which electron beam produces an image, characterized in that the electron beam is generated by means of a semiconductor device as claimed in claim 1, 2, 3 or 4.

19. A display device as claimed in claim 18, characterized in that said display device has a fluorescent screen which is present in vacuo at a few millimeters from the semiconductor device and which is activated by the electron beam originating from the semiconductor device.

* * * * *